US006960812B2

(12) United States Patent
Yamazaki et al.

(10) Patent No.: US 6,960,812 B2
(45) Date of Patent: Nov. 1, 2005

(54) METHOD OF FORMING AN OXIDE FILM

(75) Inventors: Shunpei Yamazaki, Tokyo (JP); Hongyong Zhang, Yamato (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 0 days.

(21) Appl. No.: 10/459,430

(22) Filed: Jun. 12, 2003

(65) Prior Publication Data

US 2004/0043628 A1 Mar. 4, 2004

Related U.S. Application Data

(62) Division of application No. 07/966,607, filed on Oct. 26, 1992, now Pat. No. 6,586,346, which is a continuation of application No. 07/650,166, filed on Feb. 4, 1991, now abandoned.

(30) Foreign Application Priority Data

| Feb. 6, 1990 | (JP) | ............................................. 2-26824 |
| Jul. 9, 1990 | (JP) | ............................................ 2-181272 |

(51) Int. Cl.[7] ............................................. H01L 29/76
(52) U.S. Cl. ........................... 257/410; 257/347; 257/72
(58) Field of Search ............................ 257/58, 62, 410, 257/411, 347, 72

(56) References Cited

U.S. PATENT DOCUMENTS

| 3,477,936 A | | 11/1969 | Gillery et al. | |
| 3,692,571 A | * | 9/1972 | Colton et al. | ............... 438/774 |
| 3,967,253 A | * | 6/1976 | Tsuruishi | ..................... 365/108 |
| 4,007,294 A | * | 2/1977 | Woods et al. | ............... 438/474 |
| 4,470,060 A | * | 9/1984 | Yamazaki | ..................... 349/46 |
| 4,489,478 A | * | 12/1984 | Sakurai | ........................ 438/18 |
| 4,567,061 A | * | 1/1986 | Hayashi et al. | ............. 438/774 |
| 4,624,737 A | * | 11/1986 | Shimbo | ....................... 438/158 |
| 4,772,927 A | | 9/1988 | Saito et al. | |
| 4,810,673 A | | 3/1989 | Freeman | |

(Continued)

FOREIGN PATENT DOCUMENTS

| EP | 0 076 161 A2 | 4/1983 |
| EP | 0 349 187 A2 | 1/1990 |
| GB | 1096925 | 12/1967 |

(Continued)

OTHER PUBLICATIONS

Suyama et al., Chem Abstract 109573w, "High-quality gate-oxide films for low temperature fabricated polysilicon TFTS", Mar. 12, 1990, p. 750, vol. 112, No. 11.

(Continued)

Primary Examiner—Mark V. Prenty
(74) Attorney, Agent, or Firm—Nixon Peabody LLP; Jeffrey L. Costellia

(57) ABSTRACT

A method of forming an oxide film and a method of manufacturing an electronic device utilizing the oxide film is disclosed. A silicon oxide film is formed on a substrate by sputtering. Therefore, the film formation is carried out at a low temperature. The sputtering atmosphere comprises an oxidizing gas and an inert gas such as argon. In order to prevent fixed electric charges from being generated in the film and to obtain an oxide film of good properties, the proportion of argon is adjusted to 20% or less. Alternatively, a gas including halogen elements such as fluorine is added to the above sputtering atmosphere at a proportion less than 20%. Hereupon, alkali ions and dangling bonds of silicon in the oxide film are neutralized by the halogen elements, whereby a fine oxide film is obtained.

9 Claims, 8 Drawing Sheets

U.S. PATENT DOCUMENTS

| | | |
|---|---|---|
| 4,849,081 A | 7/1989 | Ross |
| 4,894,352 A | 1/1990 | Lane et al. |
| 4,943,837 A | 7/1990 | Konishi et al. |
| 5,013,691 A | 5/1991 | Lory et al. |
| 5,037,766 A | 8/1991 | Wang |
| 5,275,977 A | 1/1994 | Otsubo et al. |
| 5,288,518 A | 2/1994 | Homma |
| 5,313,075 A | 5/1994 | Zhang et al. |
| 5,313,076 A | 5/1994 | Yamazaki et al. |
| 5,403,772 A | 4/1995 | Zhang et al. |
| 5,821,138 A | 10/1998 | Yamazaki et al. |
| 5,837,614 A | 11/1998 | Yamazaki et al. |
| 5,866,932 A | 2/1999 | Yamazaki et al. |
| 5,874,766 A * | 2/1999 | Hori ............ 257/411 |
| 6,025,630 A | 2/2000 | Yamazaki et al. |
| 6,586,346 B1 * | 7/2003 | Yamazaki et al. ....... 438/774 |

FOREIGN PATENT DOCUMENTS

| | | |
|---|---|---|
| JP | 61-063020 | 4/1986 |
| JP | 62-261128 | 11/1987 |
| JP | 01-149476 | 6/1989 |
| JP | 01-238024 | 9/1989 |
| JP | 03-036767 | 2/1991 |
| JP | 03-093273 | 4/1991 |
| JP | 03-268429 | 11/1991 |
| JP | 03-289140 | 12/1991 |
| JP | 04-360533 | 12/1992 |
| JP | 05-175132 | 7/1993 |
| JP | 05-267480 | 10/1993 |
| JP | 06-053503 | 2/1994 |
| JP | 06-287755 | 10/1994 |

OTHER PUBLICATIONS

Schreiber et al., J. Electrochem Soc., vol. 123, No. 1, pp. 30–33 (1976).

Harding, "High Rate D.C. Reactively Sputtered Metal–Oxy–Fluorine Dielectric Materials", Thin Solid Films, vol. 138, pp. 279–287, 1986.

European Search Report, Jul. 1991.

Suyama et al., "Effects of Oxygen–Argon Mixing on Properties of Sputtered Silicon Dioxide Films", Journal of the Electrochemical Society, vol. 134, No. 9, Sep. 1987, pp. 2260–2264.

Ng, Kwok K., "Complete Guide to Semiconductor Devices", New York: McGraw–Hill, Inc., 1995, pp. 1–2.

McGraw–Hill Dictionary of Scientific and Technical Terms, Third Edition, McGraw–Hill Book Company, p. 823.

Handbook of Chemistry and Physics, $55^{th}$ Edition, CRC Press, Inc.

* cited by examiner

METHOD OF FORMING AN OXIDE FILM

This is a division of application Ser. No. 07/966,607, filed Oct. 26, 1992, now U.S. Pat. No. 6,586,346, which is a continuation of application Ser. No. 07/650,166 filed Feb. 4, 1991, now abandoned.

BACKGROUND OF THE INVENTION

1. Field of the Invention

The present invention relates to a method of forming an oxide film and further a method of manufacturing an electronic device utilizing an oxide film.

2. Description of the Prior Art

In recent years, researchers are attracted by thin film transistors utilizing non-single crystalline semiconductor thin films.

Conventionally, such a non-single crystalline semiconductor thin film is formed on an insulating substrate by chemical vapor deposition, so that a temperature during the film formation is as low as 450° C. or less. Therefore, soda-lime glass, boro-silicate glass, and the like can be used as the substrate.

The thin film transistor recently attracting researchers is a field effect transistor (simply referred to as FET) having the same function as that of MOS FET. The size of the thin film transistor is limited only by the size of the apparatus to be used for formation of a semiconductor thin film constituting the transistor, so that it is easy to form transistors on large-sized substrates. Such large-sized thin film transistors are promising. For example, the large-sized thin film transistors can be used as switching elements of liquid crystal displays having a lot of pixels in the form of matrix or switching elements of one dimensional or two dimensional image sensors or the like.

It is possible to implement a conventional fine processing to the semiconductor thin films. Hence, the thin film transistor can be formed by means of a conventional fine processing, for example photolithography technique. And it is also possible to make the thin film transistor integrated as a function element of a part of monolithic IC.

Referring to FIG. 2, a typical structure of a conventional thin film transistor is schematically illustrated.

Source and drain electrodes 24 and 25 are provided on an insulating substrate 20 made of glass and source and drain regions 22 and 23 are provided on the source and drain electrodes 24 and 25 respectively and a non-single crystalline semiconductor thin film 21 is provided on the substrate 20 and a gate insulating film 26 is provided on the semiconductor thin film 21 and a gate electrode 27 is provided on the gate insulating film 26.

In the thin film transistor, electric current flowing between the source region 22 and the drain region 23 is controlled by a voltage applied to the gate electrode 27.

A gate oxide film constituting such a thin film transistor was conventionally formed by exposing a semiconductor material to thermal oxidation or by thermal CVD under a reduced or atmospheric pressure, or the like.

Electric characteristics of the thin film transistor largely depend on the quality of a channel region of the semiconductor film and the quality of the gate insulating film. For this reason, a gate insulating film of particularly good quality has eagerly been required.

In the case of the formation of the gate oxide film by exposing a semiconductor material to thermal oxidation or by thermal CVD under a reduced or atmospheric pressure, the temperature during the formation of the gate insulating film should be as high as approximately 600° C. in order to obtain a thin film transistor of good electric characteristics. So that, a heat-resistant substrate material such as quartz glass had to be utilized though it is expensive.

With respect to a method for forming a gate insulating film at a low temperature, a plasma CVD and a sputtering method utilizing an argon gas for sputtering are well-known. This sputtering method is implemented in an atmosphere comprising a large amount of argon, specifically an atmosphere comprising 100 to 80 volume % Ar atoms and 0 to 10 volume % oxygen. This is because probability of an atom or a cluster of atoms being dislodged from a target by collision of one inert gas atom, for example one Ar atom, is high (in other words, sputtering yield of Ar gas is high). However, in both the plasma CVD and the sputtering method using a large amount of argon, the gate insulating film involves numbers of elements (e.g. inert gas elements such as Ar) which was involved in a target or existed in a chamber during the CVD or the sputtering, resulting in generation of fixed electric charges in the gate insulating film. Further, ions of the elements bombard a surface of an activated layer in a thin film transistor and thereby give a damage thereto. Hereupon, a mixed layer of the activated layer and the gate insulating film is formed in the vicinity of an interface between the activated layer and the gate insulating film. As a result, interfacial level is formed at the interface and a thin film transistor of fine characteristics cannot be obtained by any of those methods.

It has been attempted to form a gate insulating film by a photo CVD method, and an interfacial level density of the gate insulating film was about $2 \times 10^{10}$ $eV^{-1}$ $cm^{-2}$, almost the same as that of a thermal oxidation film. However, the photo CVD method required a long period of time, in other words, the film formation speed was extremely slow, so that the photo CVD method was not suitable for an industrial application.

Referring now to FIG. 7, a network of silicon oxide formed by sputtering in an atmosphere comprising a large amount of argon is illustrated. Symbols 0 in the drawing indicate oxygen or silicon and symbols X indicate dangling bonds of silicon. A silicon oxide film including a gate insulating film is not dense when quantity of fixed electric charges is large in the silicon oxide film. The larger the number of dangling bonds of silicon in the silicon oxide film is, the larger the quantity of fixed electric charges is. And the larger the number of $Ar^+$ in the silicon oxide film is, the larger the quantity of fixed electric charges is. $Ar^+$ and Ar tend to stay inside the silicon oxide network as illustrated in FIG. 7 ($Ar^+$ and Ar do not tend to be substituted for Si or 0 in the network). In fact, numbers of dangling bonds of silicon tend to be generated in the silicon oxide film when the silicon oxide film is formed by sputtering in an atmosphere comprising a large amount of argon. This is partly because internal stress is generated in the silicon oxide film by Ar or $Ar^+$ present inside the silicon oxide network and partly because defects are formed in the silicon oxide film by bombardment of argon with the silicon oxide film during sputtering.

SUMMARY OF THE INVENTION

It is an object of the present invention to provide a method of forming a dense oxide film by sputtering.

It is another object of the present invention to provide a method of forming a dense gate oxide film by sputtering.

It is another object of the present invention to provide a method of manufacturing a thin film transistor of high performance at a low temperature.

It is another object of the present invention to provide a method of manufacturing a thin film transistor of high reliability at a low temperature.

It is another object of the present invention to provide a method of manufacturing a thin film transistor of high performance at low cost.

It is a further object of the present invention to provide a method of manufacturing a thin film transistor of high reliability at low cost.

An oxide film in accordance with the present invention is formed by sputtering, so that the formation thereof can be carried out at a low temperature.

A gate oxide film in accordance with the present invention is formed by sputtering, so that the formation thereof can also be carried out at a low temperature.

The sputtering is implemented in an atmosphere comprising an inert gas and an oxide gas or an atmosphere comprising an inert gas, an oxide gas, and a gas including halogen elements, wherein the proportion of the inert gas is small in the atmosphere. If the inert gas occupies a large proportion of the atmosphere during sputtering, the formed oxide film involves numbers of inert gas elements, which results in generating fixed electric charges in the oxide film. In particular, in the case of sputtering in an atmosphere comprising much inert gas of large mass such as argon, the inert gas bombards the oxide film during the film formation and causes a lot of defects in the oxide film. As a result, fixed electric charges are generated due to the defects.

When a soda-lime glass, which is cheap, is used as a substrate, a device formed on such a substrate should be manufactured at a low temperature so that the high performance and the reliability of the device are not degraded by the soda-lime glass. In manufacture of a device comprising an oxide film, the oxide film may be formed by sputtering in accordance with the present invention or subsequently may be further annealed by means of laser or laser pulse. Further in manufacture of a device comprising a semiconductor layer, the semiconductor layer may be annealed by means of laser or laser pulse. The oxide film and the semiconductor layer are not elevated to a high temperature during the laser annealing because a laser energy is very concentrated and also the temperature of the substrate does not exceed 300° C. during the laser annealing, so that a cheap soda-lime glass can be used as the substrate.

Concerning the gate oxide film formed by sputtering, a relation between the proportion of the argon gas during sputtering and an interfacial level at the interface between the activated layer and the gate oxide film and a relation between the proportion of the argon gas during sputtering and a flat band voltage were studied. From the study, it was found that both the interfacial level and the flat band voltage largely depended upon the proportion of the argon gas. The interfacial level exerts an influence upon the performance of the gate oxide film.

FIG. 3 is a graphical diagram showing the interfacial level versus the proportion of the argon gas. The proportion of the argon gas in this case means a volume proportion (the argon gas)/(an entire gas comprising the argon gas and oxygen (oxidizing gas)) in an atmosphere during the formation of the gate insulating film constituting an insulated gate field effect transistor by means of sputtering. When the volume proportion is 50% or less, the interfacial level density of the formed film is about 1/10 of that in the case of the use of 100% argon atmosphere as apparent in FIG. 3. FIG. 4 is a graphical diagram showing the flat band voltage versus the proportion of the argon gas. A silicon oxide film was formed on a silicon semiconductor by the method of the present invention, and then an aluminum electrode of 1 mm$\phi$ was formed on the silicon oxide film by means of electron beam deposition, whereby an insulated gate field effect transistor was completed. The proportion of the argon gas in FIG. 4 means a volume proportion (the argon gas)/(the entire gas comprising argon and oxygen (oxidizing gas)) in an atmosphere during the formation of the silicon oxide film (i.e. gate insulating film) by means of sputtering. The flat band voltage depends on the amount of fixed electric charges existing in the gate insulating film. The flat band voltage tends to be large as quantity of the fixed electric charges is large. Also, the flat band voltage tends to be small as quantity of the fixed electric charges is small. As seen in FIG. 4, the flat band voltage corresponding to 0% argon gas atmosphere (i.e. 100% oxygen atmosphere) is 1.0V, which is the value of the flat band voltage of ideal C-V characteristic (referred to as ideal voltage hereinafter). That is, when the silicon oxide film formation is implemented in an atmosphere comprising 0% argon (i.e. 100% oxygen), a device with ideal C-V characteristic can be manufactured.

As described hereinbefore, it is desirable to form a gate insulating film by means of sputtering in an atmosphere comprising less amount of argon.

When the volume proportion is no more than 20%, flat band voltage is close to the ideal voltage as shown in FIG. 4. As seen from FIGS. 3 and 4, it is preferred that, in the case of the sputtering atmosphere comprising an oxidizing gas and an inert gas, the oxidizing gas should occupy no less than 50%, preferably no less than 80%, typically 100%, of the sputtering atmosphere. Also it is preferred that, in the case of the sputtering atmosphere comprising an oxidizing gas, an inert gas, and a gas including halogen elements, the gas including halogen elements and the oxidizing gas should occupy no less than 50%, preferably no less than 80%, typically 100%, of the sputtering atmosphere.

Sample A and sample B each of which comprises a P-type single crystalline silicon substrate of 1 to 2 Ω·cm, a silicon oxide film involving halogen elements formed thereon by the method of the present invention, and an aluminum electrode (gate electrode) of 1 mm$\phi$ formed on the silicon oxide film were prepared. The sample A and the sample B were then annealed at 300° C. With respect to the sample A, BT (bias-temperature) treatment (A) in which a negative bias voltage was applied to the gate electrode of the sample A at $2 \times 10^6$V/cm at 150° C. for 30 minutes was carried out. With respect to the sample B, BT (bias-temperature) treatment (B) which was same as the BT treatment (A) except for application of a positive bias voltage in stead of the negative bias voltage was carried out. The difference between the flat band voltage $V_A$ of the sample A after the BT treatment (A) and the flat band voltage $V_B$ of the sample B after the BT treatment (B) was as large as 9V (The difference is referred to as $\Delta V_{FB}$ (=$|V_A - V_B|$) hereinafter). The reason why the $\Delta V_{FB}$ was as large as 9V is that positive ions such as alkali ions, for example sodium ions, were involved in the samples during the formation of the samples. However, when even a few halogen elements, for example fluorine, was added during the formation of the samples, the value of $\Delta V_{FB}$ was largely reduced. This is because the positive ions such as alkali ions were electrically neutralized by the added halogen elements as shown by the following formulae.

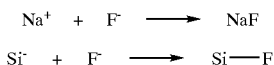

Besides, dangling bonds of silicon can be neutralized by the added halogen elements such as fluorine. It is known that dangling bonds of silicon can also be neutralized by hydrogen. However, Si—H bonds obtained by the neutralization are again decomposed by a strong electric field (e.g. BT treatment), so that dangling bonds of silicon appear again, resulting in an interfacial level. Therefore, neutralization by the use of fluorine is preferred.

FIG. 5(A) is a graphical diagram showing a relation between $\Delta V_{FB}$ and a proportion of a fluoride gas. Measurement of the $\Delta V_{FB}$ was carried out with respect to samples which had been prepared in the same way as the samples A and B except that formation of silicon oxide film had been carried out by sputtering in an atmosphere comprising a fluoride gas and an oxidizing gas. FIG. 5(B) shows a relation between the proportion of a fluoride gas and dielectric strength which is defined as a voltage gradient in units of V/cm corresponding to a leak current of 1 $\mu$A. Measurement of the dielectric strength was carried out with respect to samples which had been prepared in the same way as the samples A and B except that formation of silicon oxide film had been carried out by sputtering in an atmosphere comprising a fluoride gas and an oxidizing gas. In FIGS. 5(A) and (B), the proportion of a fluoride gas means a volume proportion (the fluoride gas)/(the entire gas comprising the fluoride gas and the oxidizing gas) in the atmosphere.

There was dispersion in the relation between the proportion of a fluoride gas and the dielectric strength. In the graphical diagram of FIG. 5(B), dielectric strength values and their dispersion ranges (a values) are shown. When the proportion of a fluoride gas exceeds 20 volume %, the values of the dielectric strength of the obtained silicon oxide film are lowered and the a values are increased. So that, the proportion of the added halogen elements is preferably no more than 20 volume %, more preferably in the range of 0.2 to 10 volume % in the present invention. According to SIMS (Secondary Ion Mass Spectroscopy), the amount of fluorine in the film was measured to be 1 to $2 \times 10^{20}$ cm$^{-3}$ in the case of adding fluorine at a proportion (fluorine)/(oxygen) of 1 volume % during the film formation. From this measurement, it is recognized that fluorine is an element easily involved in a silicon oxide film when added during film formation by sputtering. However, as recited hereinbefore, when the fluorine was added too much, e.g. more than 20 volume %, the obtained silicon oxide film was degraded and the dielectric strength of the film was low with large dispersion.

In the present invention, any of RF sputtering method, DC sputtering method, and the like may be adopted as a sputtering method. However, RF magnetron sputtering method is suitable for the purpose of maintaining a stable discharge when a sputtering target is made from oxide of low conductivity such as $SiO_2$ or artificial quartz.

As the oxidizing gas used in the present invention, oxygen, ozone, dinitrogen monoxide (nitrous oxide), and the like are preferable. In the case of ozone or oxygen, oxygen atoms in the ozone or oxygen might be involved in an obtained oxide film, however, the oxygen atoms do not cause fixed electric charges in the obtained film since they are main ingredients of the oxide film. Accordingly an extremely fine oxide film involving less impurity atoms can be obtained. Besides, since the mass of the oxygen atom is less than that of an Ar atom, even if such oxygen atoms collide with an oxide film formed on a substrate during the film formation, there are few defects caused in the oxide film. Therefore, an excellent oxide film can be obtained.

With respect to the gas including halogen elements, a fluoride gas selected from the group consisting of nitrogen fluoride ($NF_3$, $N_2F_4$), hydrogen fluoride (HF), fluorine ($F_2$), or fleon gas can be used. $NF_3$ is preferable since it is easily decomposed and it is convenient for use. Alternatively, a chloride gas selected from the group consisting of carbon tetrachloride ($CCl_4$), chlorine ($Cl_2$), hydrogen chloride (HCl), or the like can be used. The proportion of the gas including halogen elements, e.g. nitrogen fluoride, to an oxidizing gas is preferably 0.2 to 20 volume % in the present invention. These halogen elements effectively neutralize alkali ions such as sodium existing in a silicon oxide film and neutralize dangling bonds of silicon by a heat treatment. On the contrary, if the halogen element added to the silicon oxide film is too much, there is a possibility that the silicon oxide film is somewhat removed in the form of a silicon-containing gas, for example $SiF_4$. For this reason, the proportion (halogen element)/(silicon) in the silicon oxide film is preferably 0.1 to 5 atom %.

It is preferred to use materials of high purity during sputtering in order to obtain a gate insulating film containing less impurities. For example, artificial quartz of no less than 4 N, such high purity silicon as to be used as a substrate for LSI, and the like are most preferable as a sputtering target.

Besides, it is preferred that a gas of high purity no less than 5 N is used for sputtering in order to prevent impurities from entering a gate insulating film.

DETAILED DESCRIPTION OF THE PREFERRED EMBODIMENTS (Embodiment No. 1)

Figure 6A:
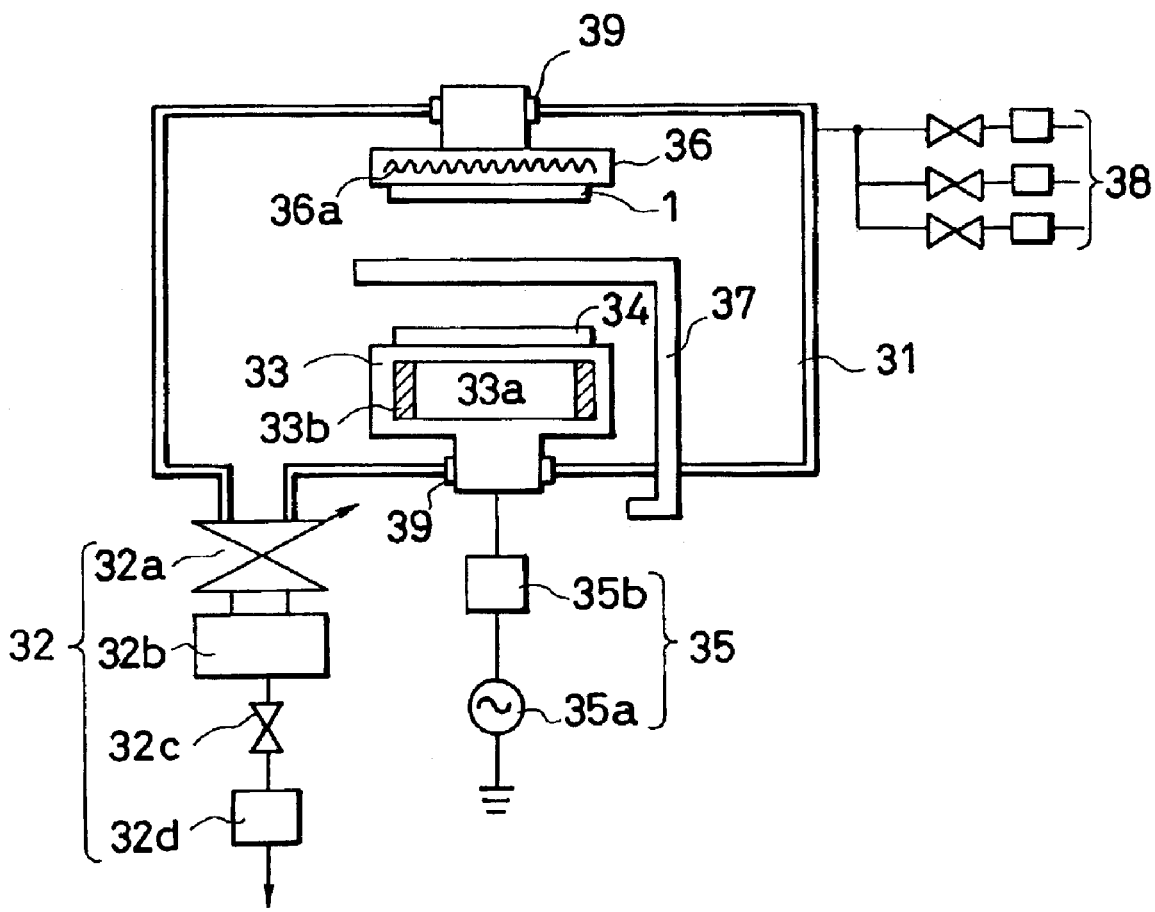
FIG. 6(A) is a schematic view showing a magnetron RF sputtering apparatus used during sputtering in accordance with the present invention.
Figure 6B:
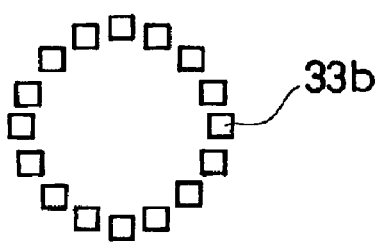
FIG. 6(B) is an explanatory view showing arrangement of magnetic field inducing means provided in the apparatus illustrated in FIG. 6(A).
Figure 7:
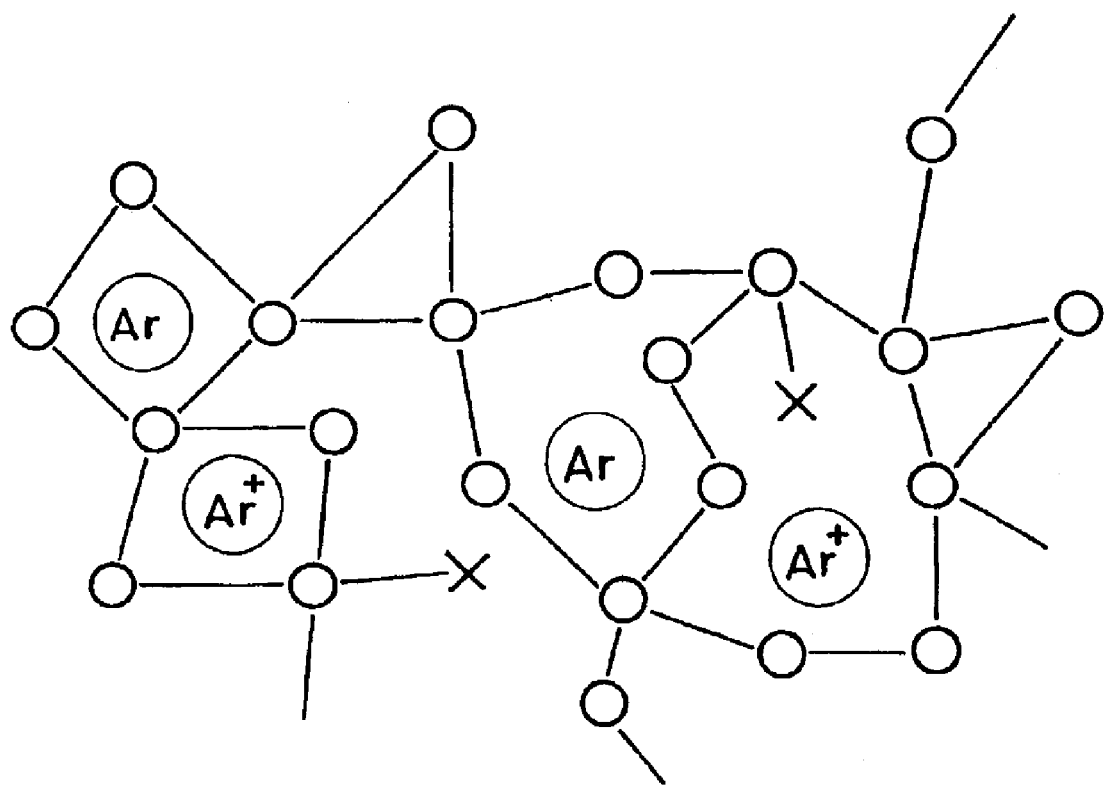
FIG. 7 is an explanatory view showing a network of silicon oxide in the prior art.

Referring to FIG. 6(A), a planar type magnetron RF sputtering apparatus suitable for use in manufacturing oxide films or electronic devices in accordance with the present invention is illustrated. The apparatus comprises a vacuum chamber 31, an evacuation system 32 consisting of a turbo molecular pump 32b and a rotary pump 32d respectively provided with valves 32a and 32c, a metallic holder 33 fixed in the lower side of the chamber 31 for supporting a target 34 thereon, formed with an inner conduit 33a through which a coolant can flow to cool the target 34 and provided with a number of permanent magnets 33b, an energy supply 35 consisting of an RF (e.g. 13.56 MHz) source 35a provided with a matching box 35b for supplying RF energy to the holder 33, a substrate holder 36 located in the upper position of the chamber 31 for supporting a substrate 1 to be coated, a heater 36a embedded in the substrate holder 36, a shutter 37 intervening the substrate 1 and the target 34 and a gas feeding system 38. Numeral 39 designates sealing means for ensuring air-tight structure of the vacuum chamber 31. In advance of actual deposition on the substrate 1, impurities occurring in the targets are sputtered and deposited on the shutter 37 intervening the substrate 1 and the target 34, and then the shutter is removed in order to enable normal deposition on the substrate 1. The magnets 33b are oriented to have their N poles at the upper ends and S poles at the lower ends and horizontally arranged in a circle as illustrated in FIG. 6(B) in order to confine electrons in a sputtering region between the substrate 1 and the target 34.

Referring now to FIGS. 1(A) to (E), manufacturing steps of a thin film transistor in accordance with the present invention are illustrated.

In this embodiment, a cheap soda-lime glass was used as a substrate 1. On the substrate 1, an I-type non-single crystalline semiconductor layer was formed by a known plasma CVD. Followings are conditions of the formation of the above semiconductor layer.

| Substrate Temperature | 350° C. |
| Pressure during Reaction | 0.06 Torr |
| RF Power (13.56 MHz) | 100 W |
| Gas to be Used | $SiH_4$ |
| Film Thickness | 2000 Å |

The semiconductor layer was patterned into semiconductor islands with a metal mask.

The patterning may be carried out by means of a known photolithography technique instead of the metal mask. In FIGS. 1(A) to (E), reference numeral 2 designates one of the semiconductor islands.

Figure 1A:
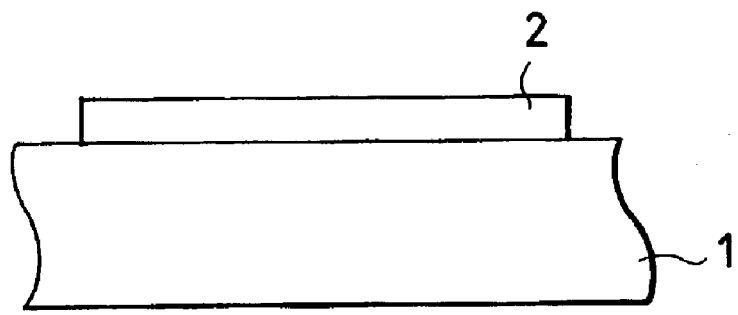
FIGS. 1(A) to (E) show manufacturing steps in accordance with the present invention.
Figure 1B:
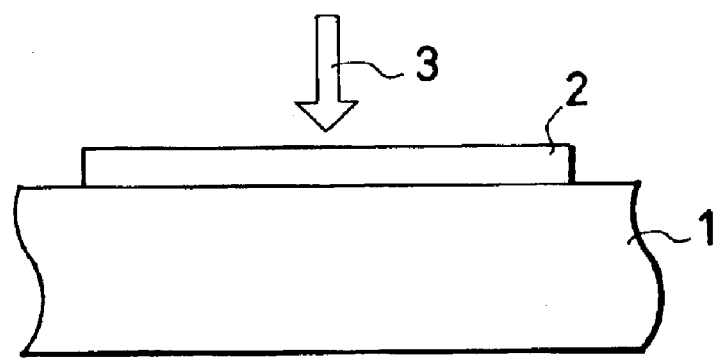

Then, as shown in FIG. 1(B), the non-single crystalline semiconductor island 2 was crystallized by radiating the island 2 with excimer laser light 3 to be polycrystalline of large crystal size or single crystalline of almost the same crystal size as the size of an element region to be formed. Followings are conditions of the radiation of the excimer laser light 3.

| Wave length of Laser Light | 284 nm (KrF) |
| Amount of Energy for Radiation | 200 mJ/cm$^2$ |
| Shot Number | 10 |
| Pulse Width of Laser Light | 30 ns |

Figure 1C:
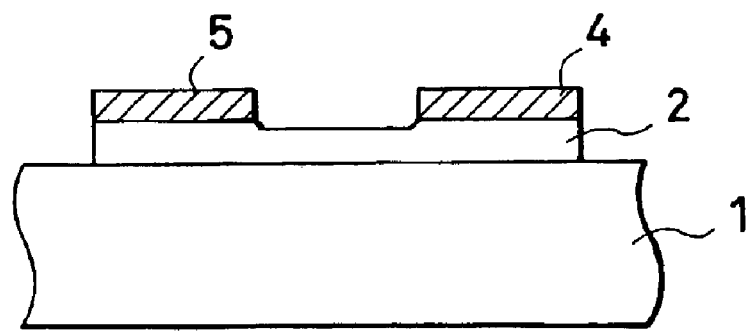

Then, an N-type non-single crystalline semiconductor layer was formed on the entire surface of the I-type semiconductor island 2 by a known plasma CVD method and was subsequently patterned into source and drain regions 4 and 5 as shown in FIG. 1(C). Followings are conditions of the formation of the N-type non-single crystalline semiconductor layer.

| Substrate Temperature | 250° C. |
| Pressure During Reaction | 0.05 Torr |
| RF Power (13.56 MHz) | 150 W |
| Gas to be Used | $SiH_4 + PH_3 + H_2$ |
| Film Thickness | 500 Å |

Concerning the above conditions, a large amount of $H_2$ gas had been used to dilute the above gas and the RF power had been relatively high, so that the formed N-type semiconductor layer comprised microcrystals and accordingly had low electric resistance.

Figure 1D:
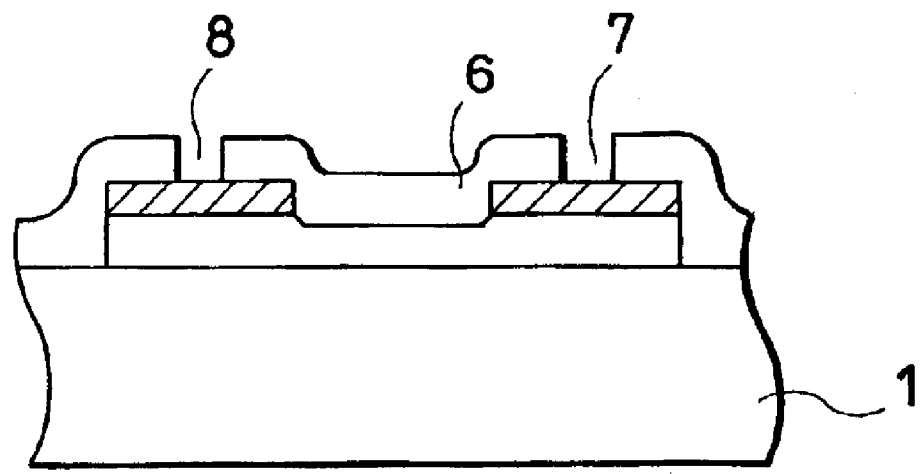

Then, a gate insulating film 6 was formed to be 700 Å in thickness on the substrate having the I-type and N-type semiconductor layers superposed thereon at 300° C. or less in the sputtering apparatus illustrated in FIG. 6(A) by RF sputtering method. After this, the gate insulating film 6 was patterned by means of photolithography technique to thereby obtain contact holes 7 and 8 for contact with the source and drain regions as shown in FIG. 1(D). Followings are conditions of the formation of the gate insulating film 6.

| Target | $SiO_2$ 99.99% |
| Reactive Gas | $O_2$ 100% |
| Pressure during Reaction | 0.5 Pa |
| RF Power | 500 W |
| Substrate Temperature | 100° C. |
| Interval between Substrate and Target | 150 mm |

Properties of the gate insulating film are as follows.

| 1/10HF Etching Speed | 67 nm/min. |
| Dielectric Strength | 9.1 MV/cm |
| Interfacial Level Density | $2.5 \times 10^{10} eV^{-1} cm^{-2}$ |

Figure 1E:
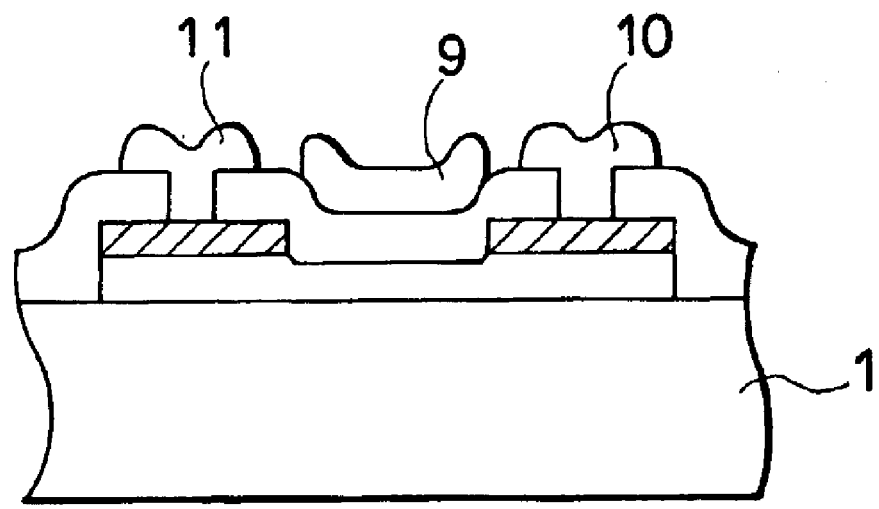
Figure 2:
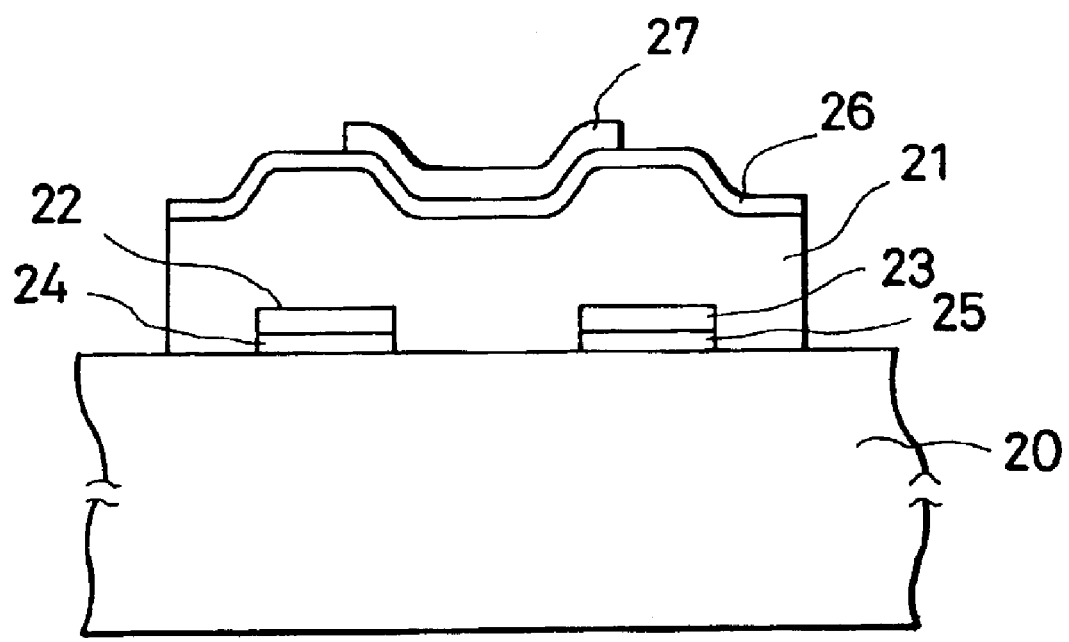
FIG. 2 is a cross sectional view schematically showing a conventional thin film transistor.
Figure 3:
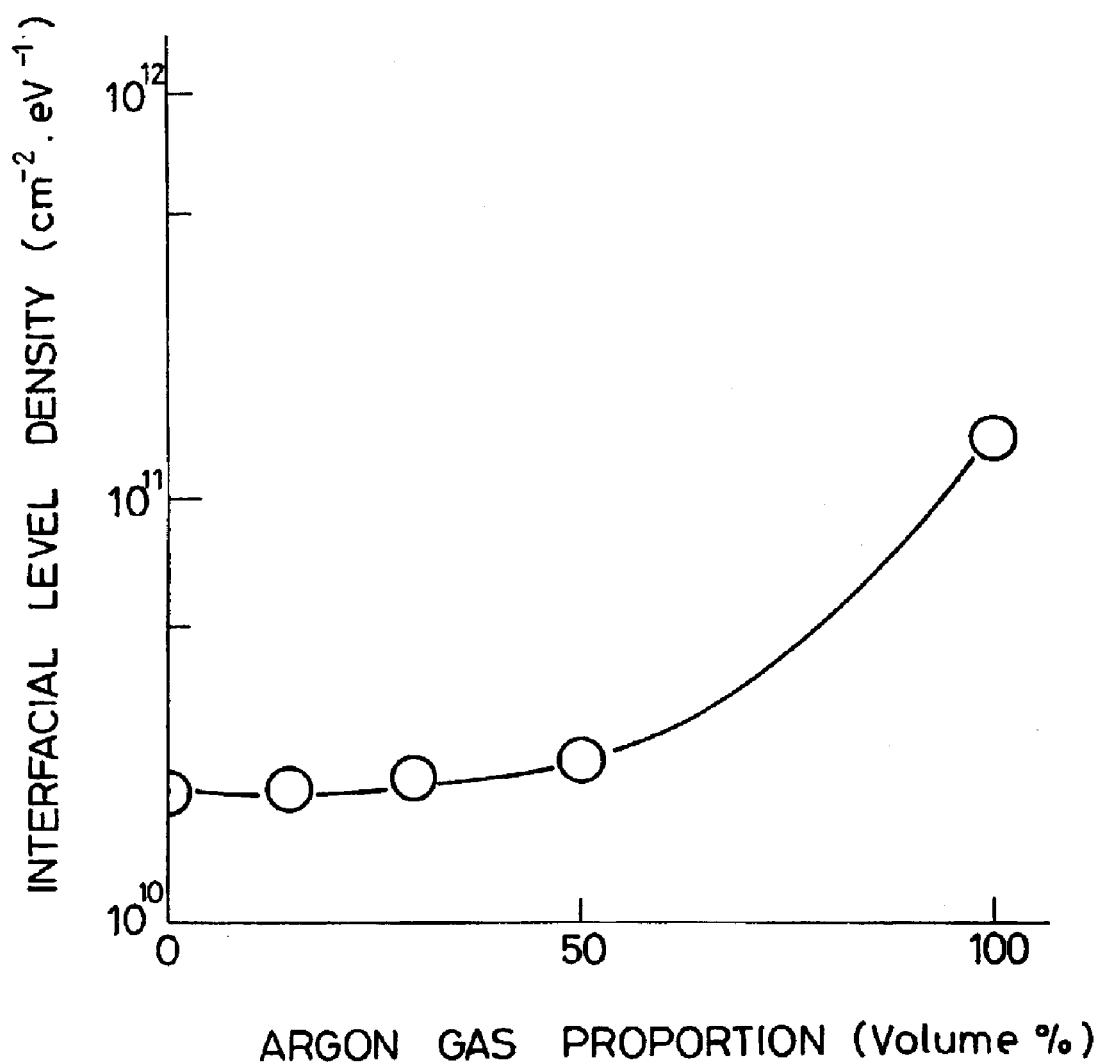
FIG. 3 is a graphical diagram showing the interfacial level density versus the Ar gas proportion during formation of a gate insulating film.
Figure 4:
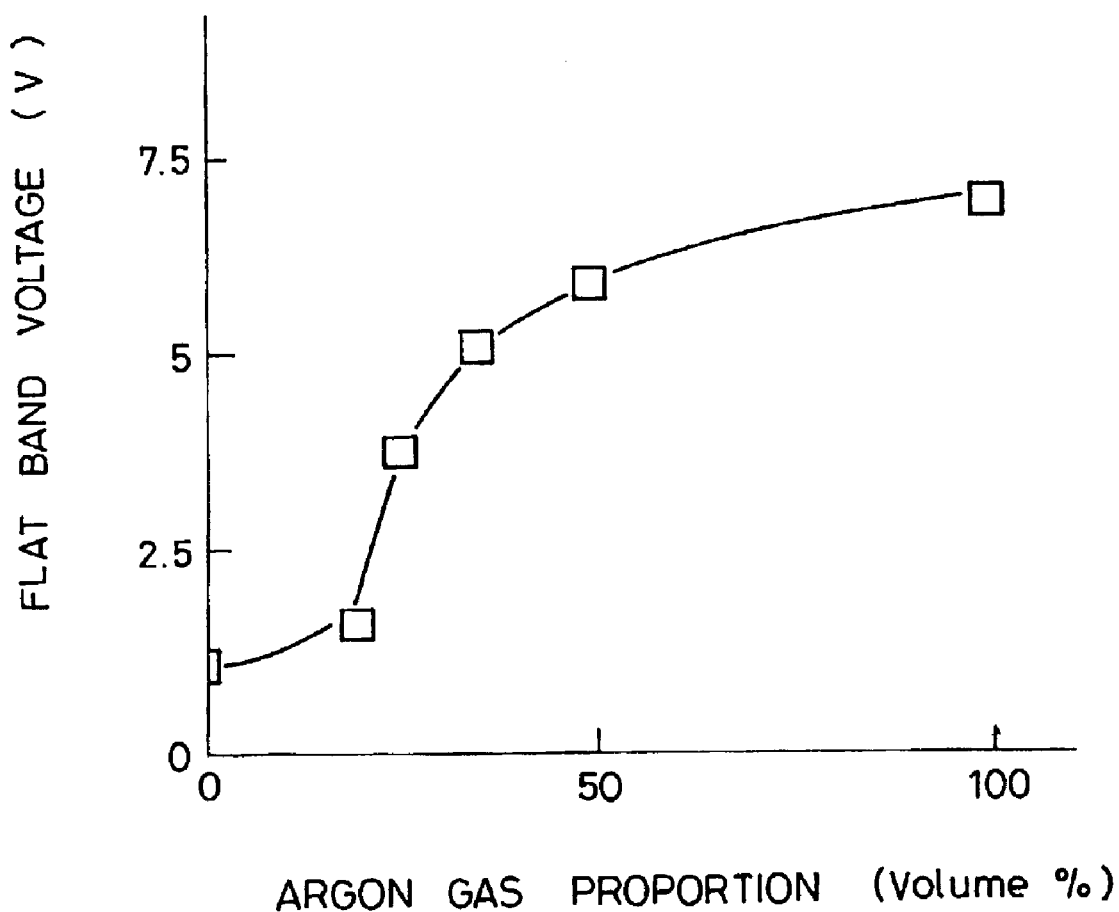
FIG. 4 is a graphical diagram showing the flat band voltage versus the Ar gas proportion during formation of a gate insulating film.
Figure 5:
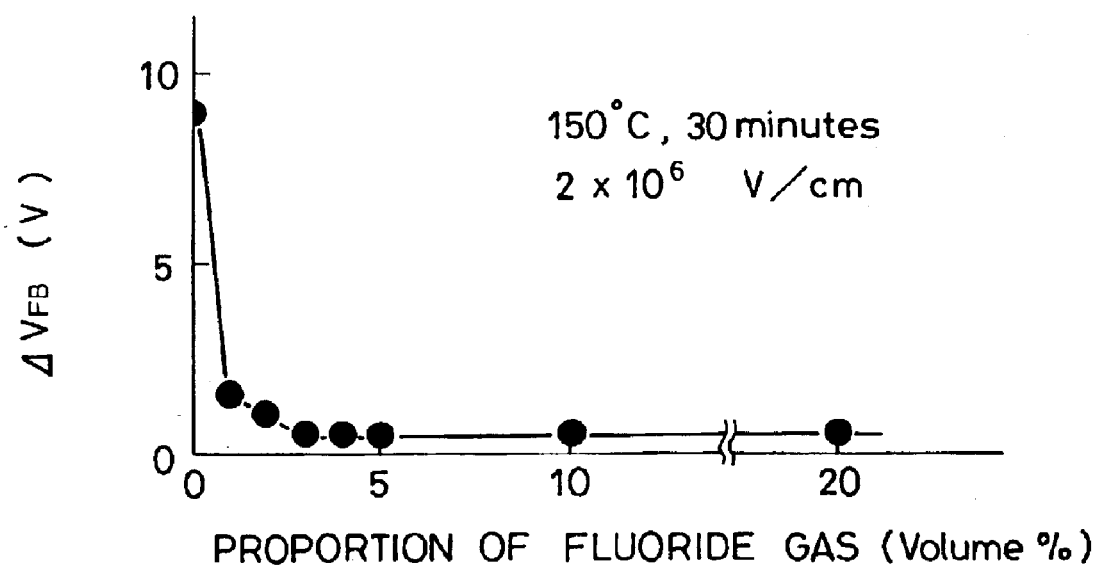
FIG. 5(A) is a graphical diagram showing the difference between flat band voltages versus the proportion of fluoride gas during formation of a gate insulating film.
FIG. 5(B) is a graphical diagram showing the dielectric strength versus the proportion of fluoride gas during formation of a gate insulating film.
Figure 5:
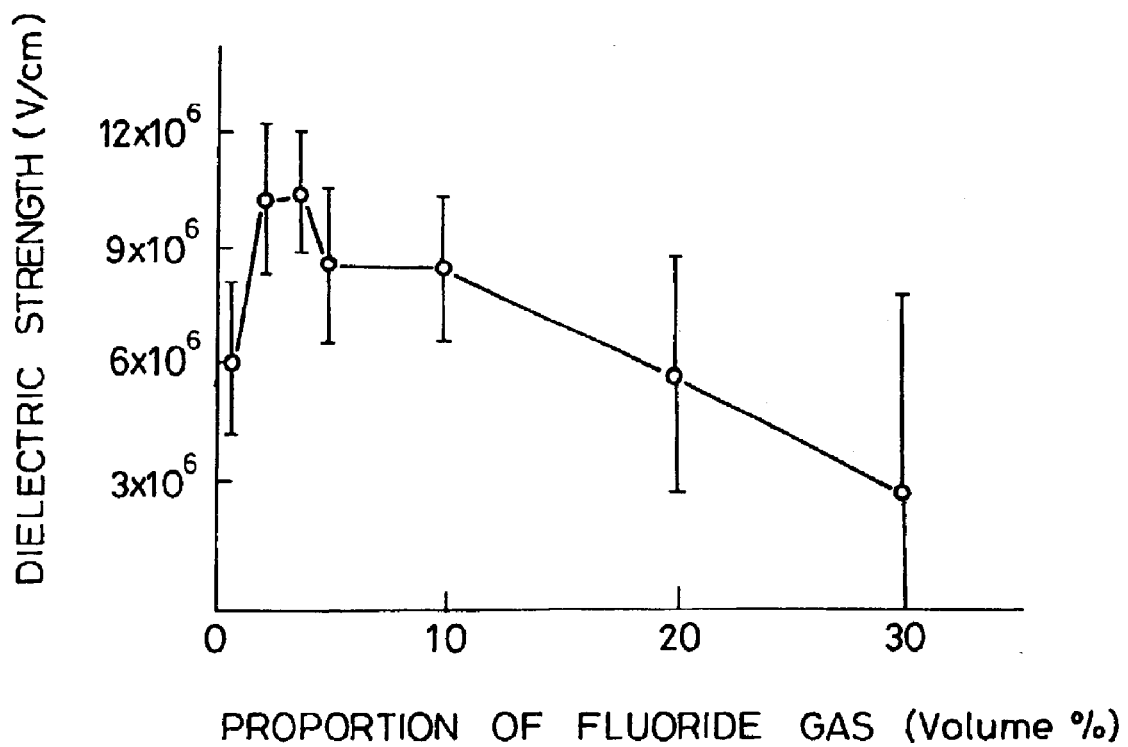

Then, a gate electrode 9, a source electrode 10, and a drain electrode 11 were formed from Al as shown in FIG. 1(E) whereby a thin film transistor was completed.

Threshold voltage (simply referred to as $V_{th}$ hereinafter) of such a thin film transistor in accordance with this embodiment could be 1V or less. On the contrary, in the case of a similar thin film transistor to the above except that a gate insulating film thereof was formed under 100% Ar gas atmosphere, the threshold voltage could not be 1V or less.

After a gate voltage was applied to the thin film transistor in accordance with this embodiment in a fixed period, $V_{th}$ thereof was measured. As a result, even after the gate voltage was applied for 1000 hours, rate of change of the $V_{th}$ was only about 0.3, that is, the rate of change of the $V_{th}$ of the thin film transistor in accordance with this embodiment was almost the same as that of a thin film transistor having a gate insulating film formed by thermal oxidation. From this result, it is understood that localized level in the gate insulating film 6 and interfacial level between the gate insulating film 6 and the semiconductor island 2 were hardly formed.

Mobility of the thin film transistor formed in accordance with this embodiment was 100 cm$^2$/V·S.

In this embodiment, the gate insulating film 6 was formed by sputtering in an atmosphere comprising 0% Ar gas. However, in the case of forming a gate insulating film by sputtering in an atmosphere in which the argon proportion $R_{AR}$ is $0\% < R_{AR} \leq 20\%$, there were no problems caused on properties of the thin film transistor. In the case of this $R_{AR}$ range, an interval between the target and the substrate is adjusted to be a long distance as compared to the case of the 0% Ar atmosphere. Thereby, almost the same quality as that of a gate insulating film formed by the use of the 0% Ar atmosphere can be obtained.

Further, when the gate insulating film formed by the use of an atmosphere comprising 20% Ar gas or less was radiated with excimer laser light to thereby be subjected to flash annealing, Ar atoms were removed from the gate insulating film and accordingly fixed electric charges were decreased in the gate insulating film. In addition, when the amount of energy of excimer laser light directed to the gate insulating film was increased, the gate insulating film could be annealed and simultaneously the underlying semiconductor layers could be crystallized and therefore the number of manufacturing steps could be reduced, that is, a step of crystallizing the semiconductor island 2 by means of radiation of excimer laser light 3 shown in FIG. 1(B) could be omitted.

In this embodiment, a turbo-molecular pump which does not cause a back-diffusion of oils and the like from evacuation system was utilized in combination with a rotary pump to evacuate a vacuum apparatus for forming a thin film transistor, so that no influences were exerted on the properties of the gate insulating film and the underlying semiconductor layers.

In this embodiment, a thin film transistor of extremely fine properties could be formed at a low temperature.

Further, the generation of fixed electric charges in a gate insulating film could be avoided as described hereinbefore, so that it was attained to provide a thin film transistor of less property change and high reliability for use in a long period of time.

In this embodiment, in order to form a gate insulating film by sputtering, $SiO_2$ was used as a target. In stead of the $SiO_2$ target, a high purity silicon, e.g. a single crystalline silicon or a polycrystalline silicon, having a purity of 99.999% or more may be used as a target.

(Embodiment No. 2)

Referring to FIGS. 1(A) to (E), manufacturing steps of a thin film transistor in accordance with this embodiment are illustrated.

In this embodiment, a soda-lime glass having a blocking layer such as silicon oxide or silicon nitride provided thereon was used as a substrate 1. On the substrate 1, an I-type non-single crystalline semiconductor layer was formed by a known plasma CVD. Followings are conditions of the formation of the above semiconductor layer.

| Substrate Temperature | 350° C. |
|---|---|
| Pressure during Reaction | 0.06 Torr |
| RF Power (13.56 MHz) | 100 W |
| Gas to be Used | $SiH_4$ |
| Film Thickness | 2000 Å |

The semiconductor layer was patterned into semiconductor islands with a metal mask.

The patterning may be carried out by means of a known photolithography technique instead of the metal mask. In FIGS. 1(A) to (E), reference numeral 2 designates one of the semiconductor islands.

Then, as shown in FIG. 1(B), the non-single crystalline semiconductor island 2 was crystallized by radiating the island 2 with excimer laser light 3 in a polycrystalline structure of large crystal size or in a single crystalline structure of almost the same crystal size as the size of an element region to be formed. Followings are conditions of the radiation of the excimer laser light 3.

| Wave length of Laser Light | 284 nm (KrF) |
|---|---|
| Amount of Energy for Radiation | 200 mJ/cm$^2$ |
| Shot Number | 10 |
| Pulse Width of Laser Light | 30 ns |

Then, an N-type non-single crystalline semiconductor layer was formed on the entire surface of the I-type semiconductor island 2 by a known plasma CVD and was subsequently patterned into source and drain regions 4 and 5 as shown in FIG. 1(C). Followings are conditions of the formation of the N-type non-single crystalline semiconductor layer.

| Substrate Temperature | 250° C. |
|---|---|
| Pressure During Reaction | 0.05 Torr |
| RF Power (13.56 MHz) | 150 W |
| Gas to be Used | $SiH_4 + PH_3 + H_2$ |
| Film Thickness | 500 Å |

Concerning the above conditions, a large amount of $H_2$ gas had been used to dilute the above gas and the RF power had been relatively high, so that the formed N-type semiconductor layer comprised microcrystals and accordingly had low electric resistance.

Then, a gate insulating film 6 involving fluorine was formed to be 1000 Å in thickness on the substrate having I-type and N-type semiconductor layers superposed thereon by the use of a reactive gas including fluorine at 300° C. or less in the sputtering apparatus illustrated in FIG. 6(A) by RF sputtering method. Subsequently the gate insulating film 6 was patterned by means of photolithography technique to produce contact holes 7 and 8 for contact with the source and drain regions as shown in FIG. 1(D). Followings are conditions of the formation of the gate insulating film 6.

| Reactive Gas | $O_2$ 95 volume % |
|---|---|
| | $NF_3$ 5 volume % |
| Pressure during Reaction | 0.05 Torr |
| RF Power | 500 W |
| Substrate Temperature | 100° C. |
| Interval between Substrate and Target | 150 mm |

Artificial quartz or a high purity silicon, for example a single crystalline silicon or a polycrystalline silicon having a purity of 99.999% or more was used as a target.

Then, a gate electrode 9, a source electrode 10, and a drain electrode 11 were formed from Al as shown in FIG. 1(E) whereby a thin film transistor was completed.

Threshold voltage ($V_{th}$) of such a thin film transistor in accordance with this embodiment could be 1V or less.

After a gate voltage was applied to the thin film transistor in accordance with this embodiment in a fixed period, $V_{th}$ thereof was measured. As a result, even after the gate voltage was applied for 1000 hours, rate of change of the $V_{th}$ was only about 0.3, that is, the rate of change of the $V_{th}$ of the thin film transistor in accordance with this embodiment was almost the same as that of a thin film transistor having a gate insulating film formed by thermal oxidation. From this result, it is understood that localized level in the gate insulating film 6 and interfacial level between the gate insulating film 6 and the semiconductor island 2 were hardly formed.

Mobility of the thin film transistor formed in accordance with this embodiment was about 100 cm$^2$/V·S.

When a gate insulating film is formed by sputtering in an atmosphere in which the argon proportion $R_{AR}$ is $0\% < R_{AR} \leq 20\%$, an interval between the target and the substrate is adjusted to be a long distance as compared to the case of forming a gate insulating film by sputtering in an atmosphere comprising 0% Ar. Thereby, almost the same quality as that of a gate insulating film formed by the use of the 0% Ar atmosphere can be obtained.

Further, the gate insulating film formed by the use of an atmosphere comprising 20% Ar gas or less may be radiated with excimer laser light to thereby be subjected to flash annealing. By this flash annealing, halogen elements such as fluorine involved in the gate insulating film can be activated and neutralize dangling bonds of silicon, so that fixed electric charges can be decreased in the gate insulating film.

When the amount of energy of excimer laser light directed to the gate insulating film was increased, fluorine and sodium involved in the gate insulating film underwent neutralization by virtue of the energy of the excimer laser light and simultaneously the underlying semiconductor layers could be crystallized and therefore the number of manufacturing steps could be reduced.

In this embodiment, a turbo-molecular pump which does not cause a back-diffusion of oils and the like from evacuation system was utilized in combination with a rotary pump to evacuate a vacuum apparatus for forming a thin film transistor, so that no influences were given to the properties of the gate insulating film and the underlying semiconductor layers.

The halogen element used in this embodiment was fluorine. This is because fluorine is active and strongly effects neutralization and has mass less than other halogen elements. However, chlorine or bromine may be used instead.

In the present invention, an oxide film can be formed at 300° C. or less by sputtering. Further in manufacture of the transistor of the present invention, all the manufacturing steps can be carried out at 350° C. or less. Due to the formation under such a low temperature, glass substrates, e.g. soda-lime glass substrate, can be utilized.

Since other modification and changes (varied to fit particular operating requirements and environments) will be apparent to those skilled in the art, the invention is not considered limited to the examples chosen for purposes of disclosure, and covers all changes and modifications which do not constitute departures from the true spirit and scope of this invention. Examples are as follows.

Although the non-single crystalline semiconductor island was radiated with laser to thereby obtain a single crystalline or polycrystalline semiconductor island in the foregoing embodiments, a non-single crystalline semiconductor island which is not subjected to laser radiation may be used in place of the single crystalline or polycrystalline semiconductor island.

Further, although the transistor formed in the foregoing embodiments was that of stagger type as shown in FIG. 1, a transistor of reverse stagger type or an insulated gate field effect transistor constituting a monolithic IC which has a single crystalline silicon layer rather than a non-single crystalline silicon layer can also be manufactured by application of the method of the present invention.

Furthermore, a transistor of vertical channel type as well as a transistor of horizontal channel type, e.g. an insulated gate field effect transistor of these types, can also be manufactured by application of the method of the present invention.

Although source and drain regions made of N-type semiconductor were formed in the foregoing embodiments, source and drain regions made of P-type semiconductor may be formed instead.

Further, the soda-lime glass substrate used in the foregoing embodiments may be replaced by other glass substrates, e.g. boro-silicate glass substrates, plastic substrates, semiconductor substrates, and conductor substrates.

What is claimed is:

1. A semiconductor device comprising:
   a substrate comprising plastic;
   a semiconductor layer over the substrate comprising plastic;
   a gate insulating film comprising silicon oxide over the semiconductor layer;
   a gate electrode over the gate insulating film; and
   source and drain electrodes over the semiconductor layer,
   wherein the gate insulating film comprises fluorine and the proportion of fluorine/silicon in the gate insulating film is 5 atom % or less, and
   wherein the gate electrode and the source and drain electrodes comprise aluminum.

2. A semiconductor device according to claim 1, wherein the semiconductor layer is crystalline semiconductor layer.

3. A semiconductor device according to claim 1, wherein the semiconductor layer is polycrystalline semiconductor layer.

4. A semiconductor device comprising:
   a substrate comprising plastic;
   a semiconductor layer over the substrate comprising plastic, wherein the semiconductor layer comprises a N-type source region and a N-type drain region;
   a gate insulating film comprising silicon oxide over the semiconductor layer;
   a gate electrode over the gate insulating film; and
   source and drain electrodes over the semiconductor layer,
   wherein the gate insulating film comprises fluorine and the proportion of fluorine/silicon in the gate insulating film is 5 atom % or less, and
   wherein the gate electrode and the source and drain electrodes comprise aluminum.

5. A semiconductor device according to claim 4, wherein the semiconductor layer is crystalline semiconductor layer.

6. A semiconductor device according to claim 4, wherein the semiconductor layer is polycrystalline semiconductor layer.

7. A semiconductor device comprising:
   a substrate comprising plastic;
   a semiconductor layer over the substrate comprising plastic, wherein the semiconductor layer comprises a P-type source region and a P-type drain region;
   a gate insulating film comprising silicon oxide over the semiconductor layer;
   a gate electrode over the gate insulating film; and
   source and drain electrodes over the semiconductor layer,
   wherein the gate insulating film comprises fluorine and the proportion of fluorine/silicon in the gate insulating film is 5 atom % or less, and
   wherein the gate electrode and the source and drain electrodes comprise aluminum.

8. A semiconductor device according to claim 7, wherein the semiconductor layer is crystalline semiconductor layer.

9. A semiconductor device according to claim 7, wherein the semiconductor layer is polycrystalline semiconductor layer.

* * * * *